United States Patent [19]
Anderson et al.

[11] 3,956,561
[45] May 11, 1976

[54] NONWOVEN ELECTRICAL INSULATION BASE FABRICS

[75] Inventors: Gary C. Anderson, Framingham; Loyd G. Kasbo, Sherborn, both of Mass.

[73] Assignee: The Kendall Company, Walpole, Mass.

[22] Filed: Mar. 14, 1975

[21] Appl. No.: 558,321

[52] U.S. Cl. .......................... 428/288; 260/857 TW; 428/296; 428/474; 428/901
[51] Int. Cl.² .......................................... B32B 27/02
[58] Field of Search .......... 428/288, 296, 220, 375, 428/474, 901, 395, 97, 338, 921; 57/140; 260/857 TW

[56] References Cited
UNITED STATES PATENTS

| | | | |
|---|---|---|---|
| 3,592,952 | 7/1971 | Fang | 260/857 TW |
| 3,642,941 | 2/1972 | Schneider et al. | 260/857 TW |
| 3,846,507 | 11/1974 | Thomm et al. | 260/857 TW |
| 3,875,129 | 4/1975 | Herwig et al. | 260/857 TW |

Primary Examiner—William J. Van Balen
Assistant Examiner—James J. Bell

[57] ABSTRACT

Nonwoven fabrics of enhanced resistance to shrinkage, degradation, and planar instability at elevated temperatures are prepared from a major portion of aramid fibers bonded by a minor portion of polyamide fibers.

3 Claims, No Drawings

NONWOVEN ELECTRICAL INSULATION BASE FABRICS

BACKGROUND OF THE INVENTION

This invention relates to nonwoven fabrics suitable for use in the electrical insulation field, and to a process for preparing such fabrics.

In the insulation of electrical equipment, as for example in the armature winding, slot lining of generators, the formation of circuit boards, and the like, maintenance of continuity of insulating value is of prime importance. The primary insulating materials, such as varnishes, epoxy resins, or mica, and the like, do not form self-sustaining manipulatable sheets of enough strength to allow their application to electrical components. Such materials therefore are commonly mounted on a supportive base such as glass cloth, nonwoven fabrics, special papers, and the like.

Supportive bases of this type must possess, as a primary requisite, a high degree of resistance to thermal degradation and to elongation or deformation under the stresses developed during the application of the insulating material and during the use of the equipment, which customarily involve elevated temperatures. If the base material stretches or deforms under low or moderate stresses, the non-elastic varnish or resin coating may develop cracks, leading to electrical leakage and loss of insulating value.

This is especially true when the primary insulating material is mica, highly desired because of its unique combination of electrical, thermal, and mechanical properties. One form of primary insulation is a mica paper, made of natural mica comminuted into finely-divided form and reconstituted into a sheet of overlapping, horizontally stratified platelets. The overlapping mica platelets form an excellent insulating medium so long as their overlapping relationship is maintained. Such sheets, however, have little strength, and are generally mounted on a strong supportive base by means of a resin, such as an epoxy, securing the mica sheet to a glass cloth.

Similar considerations govern the case where a strip of plastic film, such as polyethylene terephthalate film, is the primary insulating medium. The desirable electrical properties of such films are unfortunately coupled with a low tear strength: for many applications, therefore, it is common practise to form an adhesive laminate of a film with a nonwoven fabric, the fibrous nature of the latter serving to enhance the tear strength of the film.

With the constant demand for more compact electrical components, there is a concomitant demand for fabrics which can be processed into insulating materials of high efficiency and decreased thickness. The fabrication of ultra-thin glass fabrics is expensive and cumbersome, so that on a practical basis, nonwoven fabrics are becoming more and more widely used in the development of thin, economical, base supports for layers of electrical insulation. Heretofore, however, nonwoven fabrics with the necessary electrical properties, such as bonded nonwoven fabrics composed of polyester fibers bonded by the use of other polyester fibers of a lower softening temperature, have not offered a high degree of crosswise strength per unit of weight or thickness. In order to attain the desired value of crosswise tensile strength, the weight, and consequently the thickness, of the nonwoven fabric had to be increased to an undesirable degree.

In addition to thinness, however, the nonwoven fabric must, for reasons set forth above, possess what may be called high thermal stability: that is, a high degree of resistance to degradation and loss of strength at elevated temperatures, together with dimensional stability. Since for economic reasons it is expedient to form nonwoven fabrics from carded fibrous webs, wherein the fibers are oriented predominately in the machine direction, what is desired is a high value of crosswise tensile strength per unit of thickness.

SUMMARY OF THE INVENTION

It is a primary object of the invention to prepare a thin, flexible nonwoven fabric suitable for use as a reinforcing base for electrical insulation, circuit boards, and the like.

It is a further object of the invention to prepare such a nonwoven fabric with enhanced crosswise tensile strength, resistance to thermal degradation, and thermal stability.

Other objects of the invention will appear from the following description and claims.

DESCRIPTION OF THE INVENTION

In addition to the requirement of strength set forth above, it is desirable for high temperature applications that the fibers employed not melt, soften, or degrade under the high temperatures used in accelerated aging tests. Therefore, the principal fiber of interest in the preparation of nonwoven fabrics of this invention is a so-called aramid fiber, (an aromatic polyamide fiber in which both the amino groups and the carboxy groups are attached to an aromatic ring), such as NOMEX fiber, a trademark for duPont's fiber formed from a polyisophthalamide of meta-phenylenediamine. This fiber, which decomposes only at about 700°F, without melting, is suitable for applications requiring maintenance of integrity in electrical applications at 180°C. In the form of NOMEX paper, it has found acceptance for a variety of electrical applications. However, the short fibers used in some types of such paper lack the scuff-resistance of nonwoven fabrics. An alternative approach, therefore, has been to fabricate nonwoven fabrics from carded webs of intermingled NOMEX fibers and heat-sensitive binder fibers such as undrawn polyester fibers and subjecting the carded array to a subsequent hot calendering process as described in U.S. Pat. No. 3855047. Fabrics of this latter type, however, are deficient in crosswise strength per unit of thickness and in resistance to thermal degradation, and are not generally stable for applications involving temperatures of 180°C.

It has now been found that if aramid fibers are blended with polyamide fibers into a carded array and the resulting mixed fiber fleece is subjected to a hot-calendering operation, there is a dramatic and unexpected increase in the crosswise tensile strength of the nonwoven fabric thus prepared, with a simultaneous increase in thermal stability over nonwoven fabrics thus far available. This stability is marked not only by low shrinkage, but by resistance to buckling and planar distortion.

This result is not to be anticipated from the tenacities of the binder fibers selected, which in terms of grams per denier differ only fractionally from polyester to polypropylene to polyamide, whereas the normalized tensile strength of fabrics prepared from polyamide binders is a multiple of the tensile strengths of hitherto-available nonwoven fabrics, as illustrated by the following examples.

EXAMPLE I

A mixture of 80% 2 denier NOMEX fibers, 2 inches long, and 20% 3 denier nylon 6 fibers, 1.5 inches long, was passed through a textile carding machine to yield a web of predominately parallelized fibers, homogeneously intermingled throughout the length, breadth, and depth of the web, weighing 25 grams per square yard.

This web was then hot calendered by means of a three-roll steel-cotton-steel calender, with the steel rolls heated to about 470°F, the web being passed through both nips in an S-wrap routing. The pressure was 1,000 lbs. per inch of nip width.

The resulting thin, flexible nonwoven fabric was 2.1 mils thick, and had an absolute tensile strength of 20 pounds machine direction, 5.0 pounds cross direction, per inch-wide strip, as measured by the Instron testing machine. The normalized strength, in pounds per inch wide strip per ounce of weight per square yard, was 22.7 lbs. machine direction, 5.7 lbs. cross direction.

When the normalized cross-directional tensile strength is divided by the thickness, 2.1 mils, a figure of 2.7 lbs. per mil of thickness is obtained.

In a comparable experiment, the 80% NOMEX — 20% nylon 6 blend was replaced by an 80% NOMEX — 20% undrawn polyester blend. Calendering conditions were 1,000 lbs. pressure per inch of nip width and steel roll temperatures of 400°F, to allow for the somewhat lower softening point of the polyester fiber.

The calendered nonwoven fabric weighed 40.3 grams per square yard and had an absolute tensile strength of 13.9 lbs. per inch wide strip in the machine direction, 1.40 lbs. in the cross direction. Normalized for fabric weight, the tensile strengths calculated to be 9.8 lbs. machine direction, 0.99 lbs. cross direction. Correcting for the fabric thickness, 2.5 mils, results in a cross-directional strength of 0.4 lbs. per mil of thickness.

A third parallel experiment was run using a blend of 75% NOMEX fibers, 25% 3 denier polypropylene fibers, with the calender rolls heated to 340°F. The resultant fabric weighed 21.6 grams per square yard and was 3.0 mils thick. The normalized tensile strengths were 14.3 pounds per inch strip machine direction, 0.79 pounds cross direction. The normalized tensile strength per unit of thickness, therefore, was 0.26 pounds per inch-wide strip.

In the all-important category of unit of crosswise strength per unit of thickness of fabric, therefore, the fabrics of this invention may show as much as a six-fold increase in strength over nonwoven fabrics hitherto available.

As a measure of dimensional thermal stability at elevated temperatures, 14 inch squares of nonwoven fabrics were cut from representative samples of material, and the squares were freely suspended in a heated oven for five minutes. They were then removed, cooled, conditioned, and measured for shrinkage.

When a fabric of 80% NOMEX fibers — 20% polyamide fibers (QIANA fibers, duPont trademark for fibers composed of an cyclic polyamide copolymer) was thus heated to 350°F, shrinkage was 0.4% machine direction, zero shrinkage in the crosswise direction. A fabric of comparable weight consisting of 80% NOMEX fibers — 20% undrawn polyester fibers, under similar exposure, showed a shrinkage of 1.6% machine direction, with zero crosswise shrinkage.

In testing electrical components for anticipated service life, however, it is common practise to expose the component to temperatures up to 450° – 550°F and then test for breakdown under applied voltage. It is in this area that the marked superiority of the fabrics of this invention becomes apparent. When the above test was repeated at 240°C (464°F) and at 300°C (572°F), the NOMEX-polyamide fabric showed 0.5% shrinkage both machine and cross-direction at 240°C, and 3.1% machine direction, 2.4% cross direction at 300°C. The comparable NOMEX-polyester fabric shrank 13.5% machine direction, 8.3% cross direction at 240°C, and suffered a substantially complete loss of tensile strength at 300°C. Additionally, the NOMEX-polyester fabric buckled and curled on exposure to 300°C, while the NOMEX-polyamide fabric remained smooth and flat.

As further evidence of superior performance at elevated temperatures, two nonwoven fabrics were compared: an 80% NOMEX-20% undrawn polyester fabric weighing 30 grams per square yard, and an 80% NOMEX-20% QIANA fabric weighing 28 grams per square yard. Inch-wide strips of each fabric were suspended in an oven and were loaded with a 500 gram weight applied to the bottom of each strip, after which the temperature of the oven was gradually increased by 10° increments. The NOMEX-polyester fabric failed and broke at 335°F, whereas the NOMEX-QIANA fabric did not break at 610°F, the limit of the test method.

The stability of the QIANA-bonded nonwoven fabric at 610°F is unexpected, in view of the fact that the softening point of QIANA fiber is stated in the literature to be 447°F, and the melting point 525°F, and that the nonwoven fabrics of this invention employing QIANA fibers as the binder fiber are formed by hot calendering the NOMEX-QIANA fibrous web at 475°–495°F. It may be that prolonged exposure to heat in the testing procedure has effected a change in the polyamide binder fiber from a thermoplastic to a non-thermoplastic state, but this is merely a hypothesis.

Nonwoven fabrics with properties substantially equivalent to the fabric of Example 1 are formed whether the binder fiber is nylon 6 (polycaprolactam), nylon 66 (a polyamide from the condensation of hexamethylene diamine with adipic acid), or QIANA stated in the literature to be a polyamide copolymer from dodecanedioic acid, isophthalic acid, and methylene-bis-cyclohexyl diamine). All such fabrics, composed of major portion of NOMEX (aramid) fibers bonded by a minor portion of polyamide binder fibers are characterized by a high crosswise tensile strength per unit of thickness, low shrinkage at elevated temperatures of over 450°F, maintenance of tensile strength under similarly elevated temperatures, and maintenance of planar stability.

The proportion of thermoplastic polyamide binder fibers in the nonwoven fabric preferably will range from 10% to 40%, depending on fabric weight and tensile strength desired.

Having thus described our invention we claim:

1. A nonwoven fabric comprising a major portion of non-fusible aramid fibers in which both the amino groups and the carboxy groups are attached to an aromatic ring, bonded by a minor portion of thermoplastic polyamide fibers, said fabric being characterized by resistance to significant shrinkage and resistance to thermal degradation at a temperature of over 500°F.

2. The fabric according to claim 1 in which the thermoplastic polyamide fibers constitute between 10% and 40% of the fabric.

3. The fabric according to claim 1 in which the thermoplastic polyamide fibers are selected from the class consisting of caprolactam, polymers of hexamethylene diamine and adipic acid, and copolymers of dodecanedioic acid, isophthalic acid, and methylene-bis-cyclohexyl diamine.

\* \* \* \* \*